United States Patent
Otozawa

(10) Patent No.: US 7,964,659 B2
(45) Date of Patent: Jun. 21, 2011

(54) ANTIREFLECTION COATING COMPOSITION

(75) Inventor: Nobuyuki Otozawa, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/544,723

(22) Filed: Aug. 20, 2009

(65) Prior Publication Data

US 2009/0312471 A1    Dec. 17, 2009

Related U.S. Application Data

(63) Continuation of application No. PCT/JP2008/052890, filed on Feb. 20, 2008.

(30) Foreign Application Priority Data

Feb. 22, 2007  (JP) .................................. 2007-042418

(51) Int. Cl.
    *C08K 5/095*    (2006.01)
(52) U.S. Cl. ........ 524/319; 427/164; 427/165; 427/167; 427/240
(58) Field of Classification Search .................. 524/319; 427/164, 165, 167, 240
    See application file for complete search history.

(56) References Cited

U.S. PATENT DOCUMENTS

| | | | |
|---|---|---|---|
| 7,262,243 B2 * | 8/2007 | Otozawa et al. | |
| 2006/0024613 A1 * | 2/2006 | Otozawa et al. | |
| 2007/0238048 A1 * | 10/2007 | Matsuo et al. | 430/270.1 |

FOREIGN PATENT DOCUMENTS

| | | | |
|---|---|---|---|
| JP | 05188598 A2 * | 7/1993 | |
| JP | 07160002 A2 * | 6/1995 | |
| JP | 08044066 A2 * | 2/1996 | |
| JP | 8095253 A * | 4/1996 | |
| JP | 08305032 A2 * | 11/1996 | |
| JP | 09325500 A2 * | 12/1997 | |
| JP | 11124531 A2 * | 5/1999 | |
| JP | 2001200019 A | 7/2001 | |
| JP | 2004037887 A2 * | 2/2004 | |
| JP | 2006194962 A | 7/2006 | |
| WO | WO 2006/003958 A1 | 1/2006 | |
| WO | WO 2007/007422 A1 | 1/2007 | |

* cited by examiner

Primary Examiner — Robert D. Harlan
(74) Attorney, Agent, or Firm — Oblon, Spivak, McClelland, Maier & Neustadt, L.L.P.

(57) ABSTRACT

To provide an antireflection coating composition having a low surface tension and excellent coating properties and capable of forming an antireflection film with a low refractive index, without use of PFOS nor PFOA having 7 or more carbon atoms.
An antireflection coating composition which contains a fluorinated surfactant (A) containing a compound (A1) represented by the following formula (I), a water-soluble polymer (B) and an aqueous medium (C):

$$R^1-O-(R^2-O)_n-R^3-X^1 \qquad (I)$$

wherein $R^1$ is a linear or branched perfluoroalkyl group of which the terminal fluorine atom may be substituted by a hydrogen atom or a chlorine atom, each of $R^2$ and $R^3$ which are independent of each other, is a linear or branched perfluoroalkylene group, provided that the total number of carbon atoms in $R^1$, $R^2$ and $R^3$ is at most 5, n is 0 or an integer of at least 1, $X^1$ is —COOH or —C(CF$_2$Z$^1$)(CF$_2$Z$^2$)OH, which may form a salt, and each of $Z^1$ and $Z^2$ is a hydrogen atom, a fluorine atom, a chlorine atom or a trifluoromethyl group.

16 Claims, No Drawings

ANTIREFLECTION COATING COMPOSITION

TECHNICAL FIELD

The present invention relates to an antireflection coating composition.

BACKGROUND ART

When a pattern of a photoresist is formed by photolithography, if interference of lights reflected on the boundary between a photoresist layer and a substrate and on the surface of the photoresist layer occurs at the time of exposure, the dimensional accuracy of the pattern will be decreased. For the purpose of reducing the reflected light, a method of forming an antireflection film on the surface of the photoresist layer has been studied. The antireflection performance of the antireflection film is determined by the refractive index and the thickness of the antireflection film and the refractive index and the thickness of the photoresist layer at the wavelength of an aimed light source, and it is necessary that the refractive index of the antireflection film is low as compared with the refractive index of the photoresist layer.

In general, a composition to form the antireflection film comprises a surfactant (a), a water-soluble binder polymer (b) and an aqueous medium (c) as chief constituents, and for example, in the following Patent Documents 1, 2 and 3, a compound containing fluorine atoms is used as the surfactant (a) to reduce the refractive index of the film.

However, in recent years, influences of PFAS (perfluoroalkyl sulfonates) and PFAA (perfluoroalkyl acids) each having 7 or more carbon atoms, which have been used for a composition for an antireflection film, over the environment have been considered. There is a movement to establish a limit on their import and production in SNUR (Significant New Use Role, Mar. 11, 2002, etc.) issued by EPA (Environmental Protection Agency). Under these circumstances, a composition for an antireflection film using no PFAS nor PFAA having 7 or more carbon atoms has been strongly desired at present.

Under these circumstances, for example, the following Patent Documents 4 to 7 propose a coating composition for an antireflection film using a polymer containing fluorine atoms as the water-soluble binder polymer (b).

Patent Document 1: JP-A-5-188598
Patent Document 2: JP-A-7-160002
Patent Document 3: JP-A-8-305032
Patent Document 4: JP-A-8-44066
Patent Document 5: JP-A-9-325500
Patent Document 6: JP-A-11-124531
Patent Document 7: JP-A-2004-37887

DISCLOSURE OF THE INVENTION

Object to be Accomplished by the Invention

However, it is disclosed that in conventional coating compositions as disclosed in Patent Documents 4 to 7, as the surfactant, PFAS or PFAA having 7 or more carbon atoms or a hydrocarbon surfactant can be used. Since the coating composition for an antireflection film is applied to a resist film having a low surface tension, particularly when water is used as the aqueous medium (c), it is necessary to decrease the surface tension of the coating composition by using a considerable amount of the surfactant (a). However, a hydrocarbon surfactant does not necessarily have sufficient surface tension-decreasing performance and accordingly it should be added in a large amount, and further, since the refractive index of the hydrocarbon surfactant itself is relatively high, the refractive index of the coating composition as a whole is hardly low.

Further, Patent Document 5 discloses perfluorobutane sulfonic acid and perfluorobutanoic acid as the water-soluble fluorine compound to be contained in the composition. However, it is not clear if the antireflection film obtained by using such a compound has a uniform thickness and has a sufficiently low refractive index.

Under these circumstances, the present invention has been made to provide an antireflection coating composition having a low surface tension and excellent coating properties, and capable of forming an antireflection film with a low refractive index without use of PFAS nor PFAA having 7 or more carbon atoms.

Means to Accomplish the Object

To accomplish the above object, the antireflection coating composition of the present invention contains a fluorinated surfactant (A) containing a compound (A1) represented by the following formula (I), a water-soluble polymer (B) and an aqueous medium (C):

$$R^1-O-(R^2-O)_n-R^3-X^1 \qquad (I)$$

wherein $R^1$ is a linear or branched perfluoroalkyl group of which the terminal fluorine atom may be substituted by a hydrogen atom or a chlorine atom, each of $R^2$ and $R^3$ which are independent of each other, is a linear or branched perfluoroalkylene group, provided that the total number of carbon atoms in $R^1$, $R^2$ and $R^3$ is at most 5, n is 0 or an integer of at least 1, $X^1$ is —COOH or —C(CF$_2$Z$^1$)(CF$_2$Z$^2$)OH, which may form a salt, and each of $Z^1$ and $Z^2$ is a hydrogen atom, a fluorine atom, a chlorine atom or a trifluoromethyl group.

Effects of the Invention

According to the present invention, it is possible to realize an antireflection coating composition having a low surface tension and excellent coating properties and capable of forming an antireflection film with a low refractive index without use of PFAS nor PFAA having 7 or more carbon atoms which may be banned from the viewpoint of influences over the environment.

BEST MODE FOR CARRYING OUT THE INVENTION

Fluorinated Surfactant (A)

The fluorinated surfactant (A) (hereinafter sometimes referred to simply as a component (A)) used in the present invention contains a compound (A1) represented by the above formula (I).

The perfluoroalkyl group in the present specification means a group having all hydrogen atoms bonded to carbon atoms in an alkyl group substituted by fluorine atoms, and the ether linkage-containing perfluoroalkyl group means a group having an etheric oxygen atom inserted in the carbon chain of a perfluoroalkyl group.

The alkyl group in the perfluoroalkyl group may be linear or branched. The terminal fluorine atom of such a perfluoroalkyl group may be substituted by a hydrogen atom or a chlorine atom.

The carbon chain having an etheric oxygen atom in the ether linkage-containing perfluoroalkyl group may be linear or branched.

In the component (A), the number of carbon atoms in the fluorinated alkyl group present in the molecule is at most 5. That is, the component (A) contains no perfluoroalkyl group having 6 or more carbon atoms nor ether linkage-containing perfluoroalkyl group having 6 or more carbon atoms. The lower limit of the number of carbon atoms in such a fluorinated alkyl group is not particularly limited, but it is preferably at least 4 in view of the surface tension-decreasing performance. The number of carbon atoms is more preferably 4 or 5.

The compound (A1) has —COOH or —C(CF$_2$Z$^1$)(CF$_2$Z$^2$)OH. Each of Z$^1$ and Z$^2$ is H, F, Cl or CF$_3$.

In the component (A), the OH group in —COOH or —C(CF$_2$Z$^1$)(CF$_2$Z$^2$)OH may form a salt. Specifically, the acidic OH group may be converted to —OA$^2$ to form a salt.

A$^2$ is an alkali metal, NH$_4$, a monovalent group derived from an organic amine, or a quaternary ammonium group. The alkali metal may, for example, be lithium, sodium or potassium. Among them, A$^2$ is more preferably a monovalent group derived from an organic amine or a quaternary ammonium group.

(Compound (A1))

In the compound (A1) represented by the above formula (I), "R$^1$—O—(R$^2$—O)$_n$—R$^3$—" corresponds to the "ether linkage-containing perfluoroalkyl group".

In the above formula (I), R$^1$ a perfluoroalkyl group, which may be linear or branched. The terminal fluorine atom of R$^1$ may be substituted by a hydrogen atom or a chlorine atom. R$^1$ is preferably C$_4$F$_9$—, C$_3$F$_7$—, C$_2$F$_5$— or CF$_3$—, more preferably C$_2$F$_5$ or C$_3$F$_7$.

Each of R$^2$ and R$^3$ which are independent of each other, is a linear or branched perfluoroalkylene group. R$^2$ is preferably —CF$_2$CF$_2$— or —CF$_2$CF(CF$_3$)—, and R$^3$ is preferably —CF$_2$CF$_2$— or —CF$_2$—.

The total number of carbon atoms in R$^1$, R$^2$ and R$^3$ is at most 5, preferably from 2 to 5, more preferably 4 or 5. Further, in a case where X$^1$ in the formula (I) is —C(CF$_2$Z$^1$)(CF$_2$Z$^2$)OH, the total number of carbon atoms in R$^1$, R$^2$ and R$^3$ is preferably 4 or 5.

In the formula (I), n is 0 or an integer of at least 1, preferably 0 or an integer of from 1 to 3, more preferably 0, 1 or 2.

Since the compound (A1) is excellent in water solubility, the antireflection coating composition containing it will be in a uniformly mixed state. Thus, an antireflection film to be obtained will have a uniform composition and a uniform thickness. Further, the compound (A1) has such an advantage that it is soluble in water to a certain extent even if it is not formed into a salt with an alkali. As an important characteristic of an antireflection film, matching in the acidity with a resist as the lower layer is mentioned. If the acidity of the antireflection film is too high, the acidic component on the antireflection film side tends to infiltrate into the resist layer, thus leading to excessive film reduction and the pattern top being round (the head of each rectangle is excessively developed and scraped and becomes round). On the other hand, if the acidity is too low, the acidic component in the resist layer will move to the antireflection film, thus leading to the pattern top being in the T-shape (the development at the head of each rectangle is insufficient, and a portion which should be removed remains).

In a case where the compound (A1) is used, which is not necessarily used in the form of a salt, the acidity of the antireflection film is likely to be adjusted, and accordingly the composition can be used for coating of various resist layers.

As a preferred example of the compound (A1), a compound (A11) represented by the following formula (III) may be mentioned:

$$M^1CF_2CF_2O(CF_2CF_2O)_pCF_2COOA^1 \quad (III)$$

wherein M$^1$ is a fluorine atom, a hydrogen atom or a chlorine atom, A$^1$ is a hydrogen atom, an alkali metal, NH$_4$, a monovalent group derived from an organic amine, or a quaternary ammonium group, and p is 0 or 1.

In the formula (III), M$^1$ is a fluorine atom, a hydrogen atom or a chlorine atom, preferably a fluorine atom.

The alkali metal, NH$_4$, the monovalent group derived from an organic amine and the quaternary ammonium group as A$^1$ are the same as the above A$^2$ including the preferred embodiment. A$^1$ is preferably a hydrogen atom.

p is 0 or 1, preferably 1.

For the antireflection coating composition of the present invention, it is preferred to use the compound (A11) represented by the above formula (III) as the fluorinated surfactant (A).

In the antireflection coating composition of the present invention, as the fluorinated surfactant (A), one type may be used alone or two or more may be used in combination.

The amount of use of the fluorinated surfactant (A) is preferably set so that the surface tension of the antireflection coating composition is within a predetermined range. The preferred range of the surface tension of the antireflection coating composition depends on a coating method, and in any coating method, no favorable coating properties will be achieved if the surface tension of the antireflection coating composition is too high or too low.

For example, the content of the fluorinated surfactant (A) in the antireflection coating composition is preferably within a range of from 0.001 to 10 mass %, more preferably from 0.05 to 5 mass %, furthermore preferably from 0.1 to 1 mass %.

Water-Soluble Polymer (B)

(Water-Soluble Fluoropolymer (B1))
(Polymerized Units (b1))

As the water-soluble polymer (B) (hereinafter sometimes referred to simply as a component (B)), a known water-soluble polymer as a film-forming component for an antireflection film may be used.

As the component (B), preferred is a water-soluble fluoropolymer (b1) having polymerized units (b1) represented by the following formula (IV):

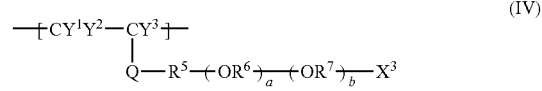

$$-\!\!\left[CY^1Y^2-CY^3\right]\!\!- \atop {\phantom{xxx}\big|\phantom{xxx}\atop Q-R^5-\!\!\left(OR^6\right)_a\!\!-\!\!\left(OR^7\right)_b\!\!-X^3} \quad (IV)$$

wherein each of Y$^1$ and Y$^2$ which are independent of each other, is a hydrogen atom, a fluorine atom or a chlorine atom, Y$^3$ is a hydrogen atom, a fluorine atom, a chlorine atom, a methyl group or a trifluoromethyl group, Q is an ether linkage or an ester linkage, each of R$^5$, R$^6$ and R$^7$ which are independent of one another, is a linear or branched perfluoroalkylene group having at most 6 carbon atoms, X$^3$ is a functional group having an acidic OH group which may form a salt, and each of "a" and "b" which are independent of each other, is 0 or an inter of at least 1.

In the formula (IV), each of Y$^1$ and Y$^2$ which are independent of each other, is a hydrogen atom, a fluorine atom or a chlorine atom. Preferably, both Y$^1$ and Y$^2$ are fluorine atoms.

$Y^3$ is a hydrogen atom, a fluorine atom, a chlorine atom, a methyl group or a trifluoromethyl group, preferably a fluorine atom.

Q is an ether linkage or an ester linkage, preferably an ether linkage.

Each of $R^5$, $R^6$ and $R^7$ which are independent of one another, is a linear or branched perfluoroalkylene group having at most 6 carbon atoms. The number of carbon atoms in each of $R^5$, $R^6$ and $R^7$ is preferably from 1 to 3, more preferably 2 or 3. As preferred examples of each of $R^5$, $R^6$ and $R^7$, $-C_2F_4-$, $-C_3F_6-$ and $-CF_2-CF(CF_3)-$ may be mentioned.

Each of "a" and "b" which are independent of each other, is 0 or an integer of at least 1. Each of "a" and "b" is preferably 0 or an integer of from 1 to 3. The total of "a" and "b" is preferably 0 or from 1 to 3.

In the formula (IV), $X^3$ is a functional group having an acidic OH group. The functional group having an acidic OH group is preferably $-COOH$, $-SO_3H$, $-OP(=O)(OH)_2$, or $-C(CF_2Z^1)(CF_2Z^2)OH$. Each of $Z^1$ and $Z^2$ is H, F, $C_1$ or $CF_3$. Particularly, $-COOH$, $-SO_3H$ or $-C(CF_2Z^1)(CF_2Z^2)OH$ is preferred. Further, $X^3$ may form a salt, but no salt is preferably formed.

The polymerized units (b1) represented by the formula (IV) are preferably polymerized units (b11) represented by the following formula (VI):

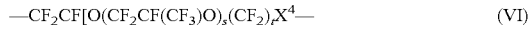  (VI)

wherein s is an integer of from 0 to 5, t is an integer of from 1 to 5, $X^4$ is $-COOH$, $-SO_3H$ or $-C(CF_2Z^1)(CF_2Z^2)OH$, and each of $Z^1$ and $Z^2$ is H, F, $C_1$ or $CF_3$.

The fluoromonomer forming the polymerized units (b11) is preferably $CF_2=CF[O(CF_2CF(CF_3)O)_{s'}(CF_2)_{t'}X^{4'}]$.

In the monomer, s' is preferably an integer of from 0 to 3, and t' is preferably from 1 to 3. $X^{4'}$ is the same group as $X^4$ in the formula (VI) or a group to be converted to $X^4$ via a hydrolysis reaction.

As preferred examples of the polymerized units (b11) represented by the formula (VI), the following polymerized units may be mentioned:

—[CF$_2$CF(OCF$_2$CF$_2$CF$_2$COOH)]—,
—[CF$_2$CF(OCF$_2$CF(CF$_3$)OCF$_2$CF$_2$COOH)]—,
—[CF$_2$CF(OCF$_2$CF(CF$_3$)OCF$_2$CF$_2$CF$_2$COOH)]—,
—[CF$_2$CF(OCF$_2$CF$_2$CF$_2$OCF$_2$CF$_2$COOH)]—,
—[CF$_2$CF(OCF$_2$CF(CF$_3$)OCF$_2$CF$_2$SO$_3$H)]—.

In the present invention, the proportion of the polymerized units (b1) to all the polymerized units constituting the water-soluble fluoropolymer (B1) is preferably at least 20 mol %, more preferably at least 60 mol %, and may be 100 mass %. If it is less than the lower limit of the above range, the water solubility of the fluoropolymer will decrease.

(Polymerized Units (b2))

The water-soluble fluoropolymer (B1) may have polymerized units other than the polymerized units (b1). For example, it may have polymerized units (b2) represented by the following formula (VII):

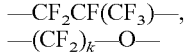  (VII)

wherein u is an integer of from 1 to 10, $X^5$ is $-COOH$, $-SO_3H$ or $-C(CF_2Z^1)(CF_2Z^2)OH$, and each of $Z^1$ and $Z^2$ is H, F, $C_1$ or $CF_3$.

The fluoromonomer forming the polymerized units (b2) is preferably $CF_2=CF[(CF_2)_{u'}X^{5'}]$. In this monomer, u' is preferably from 1 to 5. $X^{5'}$ is the same group as $X^5$ in the formula (VII) or a group to be converted to $X^5$ via a hydrolysis reaction.

(Polymerized Units (b3))

The water-soluble fluoropolymer (B1) may have polymerized units (b3) the main chain of which is the same as that of the polymerized units (b1) and which are not included in the polymerized units (b1) and (b2).

Such polymerized units (b3) are preferably polymerized units formed by cleavage of the double bond in the following fluoromonomers:

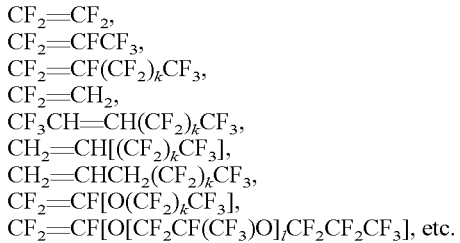

In the above, k is an integer of from 1 to 10, and l is an integer of from 1 to 3. Among them, particularly preferred is $CF_2=CF_2$, $CF_2=CFCF_3$ or the like.

(Polymerized Units (b4))

The water-soluble fluoropolymer (B1) may have polymerized units (b4) having an etheric oxygen atom in its main chain. As such polymerized units (b4), preferred are the following polymerized units.

—CF$_2$CF(CF$_3$)—,
—(CF$_2$)$_{k'}$—O—

In the above, k' is an integer of from 1 to 3.

The mass average molecular weight (as calculated as PMMA by gel permeation chromatography, the same applies hereinafter) of the water-soluble fluoropolymer (B1) is preferably at most 50,000, more preferably at most 30,000, whereby favorable water solubility will be achieved. The mass average molecular weight is preferably at least 1,000, whereby favorable film forming properties are obtained.

A method of producing the water-soluble fluoropolymer (B1) is not particularly limited, and the following method (i) or (ii) may be preferably mentioned.

(i) A method of polymerizing a fluoromonomer having a precursor functional group capable of being converted to "a functional group having an acidic OH group", and converting the precursor functional groups to "functional groups having an acidic OH group".

(ii) A method of polymerizing a fluoromonomer and introducing "functional groups having an acidic OH group" to part of the obtained polymer.

As examples of the method (i), a method of polymerizing $CF_2=CF[O(CF_2CF(CF_3)O)_{s'}(CF_2)_{t'}COOCH_3]$ (wherein s' and t' are as defined above) and then hydrolyzing the $-COOCH_3$ moiety, and a method of polymerizing $CF_2=CF[O(CF_2CF(CF_3)O)_{s'}(CF_2)_{t'}SO_2F]$ (wherein s' and t' are as defined above) and then hydrolyzing the $-SO_2F$ moiety may be preferably mentioned.

The polymerization method is not particularly limited, and a polymerization reaction by adding a polymerization initiator to the fluoromonomer, following by heating is preferred.

The polymerization initiator is preferably a peroxide, an azo compound or the like.

The peroxide may, for example, be preferably a peroxyketal, a diacyl peroxide, a peroxycarbonate, a peroxyester, ammonium persulfate or potassium persulfate.

The azo compound may, for example, be preferably an azonitrile, an azoamide, a cyclic azoamide or an azoamidine.

The amount of use of the polymerization initiator is preferably from 0.01 to 10 mol % based on the total number of moles of monomers to be used for the polymerization reaction.

Further, a chain transfer agent may be used for the polymerization reaction. The amount of the chain transfer agent used for the polymerization reaction is preferably from 0.01 to 10 mol % based on the total number of moles of the monomers.

A medium may be or may not be used for the polymerization reaction. When it is used, the polymerization reaction is carried out preferably in such a state that the fluoromonomer is dissolved or dispersed in the medium. The medium is preferably water, a fluorinated solvent or the like.

(Other Water-Soluble Polymer (B2))

As the water-soluble polymer (B) contained in the antireflection coating composition of the present invention, other water-soluble polymer (B2) containing no fluorine may be used.

As such other water-soluble polymer (B2), a known water-soluble polymer may be properly used. Specifically, it may, for example, be preferably polyvinylpyrrolidone, polyacrylic acid, polyvinyl alcohol, water-soluble polysiloxane or polysaccharide. They may be used alone or two or more may be used in combination.

The water-soluble polymer (B) contained in the antireflection coating composition of the present invention may be the water-soluble fluoropolymer (B1), may be other water-soluble polymer (B2) or may be a combination thereof. It is preferred to use at least the water-soluble fluoropolymer (B1), and as the case requires, use said other water-soluble polymer (B2) in combination so as to improve film formation properties.

The proportion of the water-soluble fluoropolymer (B1) to the water-soluble polymer (B) contained in the antireflection coating composition of the present invention is preferably at least 50 mass %, more preferably at least 70 mass %, and it may be 100 mass %. If it is less than the lower limit of the above range, the effect of decreasing the refractive index will decrease.

The content of the water-soluble polymer (B) in the antireflection coating composition of the present invention may be within a range within which the component (B) is soluble and a film having a desired thickness can be formed at the time of coating. Specifically, it is preferably from 0.1 to 20 mass %, more preferably from 1 to 10 mass %, furthermore preferably from 3 to 7 mass %.

Aqueous Medium (C)

The aqueous medium (C) is preferably selected from water and a water-soluble organic solvent. It is preferably water, or a water-soluble organic solvent and water may be used in combination.

Water is preferably one from which organic impurities, metal ions, etc. are removed by distillation, ion exchange treatment, treatment with a filter, adsorption treatment or the like.

The water-soluble organic solvent is not particularly limited so long as it is an organic solvent which is soluble in an amount of at least 0.1 mass % in water. It may, for example, be an alcohol such as methyl alcohol, ethyl alcohol, isopropyl alcohol, 2-butanol or hexylene glycol; a ketone such as acetone or methyl ethyl ketone; an ester such as methyl acetate, ethyl acetate or ethyl lactate; or a polar solvent such as dimethylformamide, dimethyl sulfoxide, methyl cellosolve, cellosolve, butyl cellosolve, cellosolve acetate, alkyl cellosolve acetate, butyl carbitol or carbitol acetate. Among them, preferred is an alcohol.

The content of the aqueous medium (C) in the antireflection coating composition of the present invention is set so that the component (A), the component (B) and other components to be added as the case requires can be contained in required amounts, respectively, and all the components are dissolved. The content of the aqueous medium (C) is preferably, for example, from 70 to 99.9 mass %, more preferably from 95 to 99 mass %.

Organic Amine (D)

An organic amine (D) may be contained as the case requires in the antireflection coating composition of the present invention. By adjusting the pH of the antireflection coating composition by addition of the organic amine (D), intermixing with the photoresist layer can be suppressed.

The organic amine (D) may, for example, be specifically $NH_3$, tetramethylammonium hydroxide ($N(CH_3)_4OH$), trimethyl-2-hydroxyethylammonium hydroxide, an alkanolamine, an alkylamine or an aromatic amine.

The content of the organic amine (D) in the antireflection coating composition can be set so that the pH of the antireflection coating composition is in a range suitable for formation of the resist pattern. For example, it is preferably within a range of from 50 to 95 mass % of the total amount of acidic functional groups.

Other Additives

Various additives may be contained as the case requires in the antireflection coating composition of the present invention. For example, a known surfactant not included in the component (A) may be added for the purpose of improving wettability and leveling properties to the photoresist layer.

Such a surfactant may, for example, be preferably a compound having a polyfluoroalkyl group and a polyoxyethylene group (manufactured by Sumitomo 3M Limited, tradename: Fluorad "FC-430", "FC-4430", etc.), acetylene glycol or a compound having polyoxyethylene added to acetylene glycol (manufactured by Air Products and Chemicals, Inc., tradename: "Surfynol 104", "Surfynol 420"), an alkyl sulfonic acid or an alkylbenzene sulfonic acid (for example, manufactured by Nikko Chemicals Co., Ltd., tradename: NIKKOL "SBL-2N-27", etc.) or a compound containing a hydroxyl group and containing no polyoxyethylene group (such as polyglycerol fatty acid ester).

Application

The antireflection coating composition of the present invention is suitable as a coating liquid to form an antireflection film for a photoresist. Specifically, in formation of a pattern by means of photolithography using a photoresist, it is suitable as a coating liquid to form an antireflection film to be formed on the surface of a photoresist layer. The photoresist layer is not limited, and the coating composition can be applied to photoresists for g-line, for i-line and for an excimer laser such as KrF or ArF.

Method for Forming Antireflection Film

The antireflection coating composition of the present invention is applied to the surface on which an antireflection film is to be formed, to form a coating film, and then the solvent in the coating film is removed to form an antireflection film. The application method is preferably a spin coating method, in view of excellent uniformity of a coating film and simplicity. After a coating film is formed, drying by heating may be carried out by e.g. a hotplate or an oven as the case requires. The drying is carried out preferably under conditions at from 70 to 100° C. for from 30 to 180 seconds in the case of a hotplate for example.

In a case where the antireflection film is to prevent reflection at the time of exposure in the photolithography, the thickness of the antireflection film may be set in accordance with a known antireflection theory. Specifically, it is preferably an odd number times "(exposure wavelength)/(4×refractive index of the antireflection film)", in view of excellent antireflection performance.

The antireflection coating composition of the present invention has an effectively decreased surface tension by addition of the above fluorinated surfactant (A) to the water-soluble polymer (B) and the aqueous medium (C) and thereby realizes excellent coating performance. Further, as shown in the after-mentioned Examples, the fluorinated surfactant (A) has a high effect of decreasing the surface tension as compared with a conventional surfactant, and accordingly favorable coating performance is achieved by addition of a relatively small amount. Further, the fluorinated surfactant (A) itself contains fluorine and thereby has a low refractive index, and accordingly the increase in the refractive index of the antireflection film by addition of the fluorinate surfactant (A) to the antireflection coating composition can be prevented. Further, the fluorinated surfactant (A) has an acidic OH group similar to a fluoropolymer, and accordingly a phenomenon such as agglomeration by the action of functional groups is less likely to occur, whereby excellent storage stability of the composition solution will be achieved.

Therefore, according to the present invention, a coating composition which decreases the surface tension of a coating liquid without deteriorating the refractive index of the composition, and having high coating performance, without use of a compound which may be banned in view of influences over the environment, such as PFAS having 7 or more carbon atoms, can be obtained.

Particularly, it is preferred to use the water-soluble fluoropolymer (B1) as the water-soluble polymer (B), since the polymer (B1) contains fluorine and thereby has a low refractive index, whereby an antireflection film having a low refractive index can be formed. Further, the polymer (B1) has an acidic OH group, whereby the antireflection film will be excellent in water solubility. Accordingly, the antireflection film is easily dissolved in a developer to be used in the photolithography, and it is easily removed in a development step.

EXAMPLES

Now, the present invention will be described in further detail with reference to Examples. However, it should be understood that the present invention is by no means restricted to such specific Examples.

Preparation Example 1

Preparation of Water-Soluble Fluoropolymer (B1)

A polymer (B1) comprising polymerized units (b11) represented by the above formula (VI) was prepared in accordance with the above method (i).

That is, the air in the system of a 1.3 L autoclave equipped with a stirrer was replaced with nitrogen, 1.18 kg of $CF_2=CFOCF_2CF_2CF_2COOCH_3$ (hereinafter referred to as CVE) and 5.30 g of diisopropyl peroxydicarbonate as a polymerization initiator were charged, and the internal pressure was adjusted to 0.1 MPa by nitrogen. The autoclave was heated so that the internal temperature would be 40° C., and stirring was carried out at 40° C. for 12 hours to carry out a polymerization reaction. After completion of the stirring, unreacted CVE was distilled off to obtain 470 g of a precursor polymer having CVE polymerized. The mass average molecular weight of the precursor polymer was measured by a GPC method and found to be $5\times10^3$.

Water was added to the obtained precursor polymer and heated up to 90° C., followed by stirring at 90° C. for 5 hours to carry out hydrolysis of methyl ester groups derived from CVE. Then, 10 g of acetic acid was added, and the temperature was increased to 90° C., followed by stirring for 1 hour, and water was added to obtain an aqueous solution of a water-soluble fluoropolymer (B1) having at least 95 mol % of methyl ester groups of the precursor polymer converted to —COOH. The non-volatile component concentration of the aqueous solution was 30 mass %.

Example 1

The aqueous solution of the water-soluble fluoropolymer (B1) obtained in Preparation Example 1 was diluted with water, and a fluorinated surfactant (A11-1) represented by the following formula (III-1) was added and mixed to obtain an antireflection coating composition. The content (unit: mass %) of the water-soluble fluoropolymer (B1) and the content (unit: mass %) of the surfactant (A11-1) in the antireflection coating composition are shown in Table 1.

$$CF_3CF_2OCF_2CF_2OCF_2COOH \qquad (III-1)$$

Examples 2 to 4

An antireflection coating composition was prepared in the same manner as in Example 1 except that the content of the water-soluble fluoropolymer (B1) and the content of the fluorinated surfactant (A11-1) in the antireflection coating composition were changed as identified in Table 1.

Comparative Example 1-1

An antireflection coating composition was prepared in the same manner as in Example 1 except that the fluorinated surfactant was changed to a fluorinated surfactant (A2-1) represented by the following formula (II-1).

$$CF_3(CF_2)_4COOH \qquad (II-1)$$

Comparative Examples 1-2 to 1-4

An antireflection coating composition was prepared in the same manner as in Comparative Example 1-1 except that the content of the water-soluble fluoropolymer (B1) and the content of the fluorinated surfactant (A2-1) in the antireflection coating composition were changed as identified in Table 1.

Comparative Example 1

An antireflection coating composition was prepared in the same manner as in Example 1 except that NIKKOL SBL-2N-27 (tradename, manufactured by Nikko Chemicals Co., Ltd.) which is a commercially available non-fluorinated surfactant was used instead of the fluorinated surfactant (A11-1).

Comparative Examples 2 to 4

An antireflection coating composition was prepared in the same manner as in Comparative Example 1 except that the content of the water-soluble fluoropolymer (B1) and the content of the non-fluorinated surfactant (NIKKOL) were changed as identified in Table 1.

Comparative Example 5

An antireflection coating composition was prepared in the same manner as in Example 1 except that no fluorinated surfactant (A11-1) was added in Example 3.

Comparative Examples 6 to 8

Antireflection coating compositions were prepared in the same manner as in Examples 1, 3 and 4, respectively, except that dodecylbenzenesulfonic acid used in Examples 1 to 4 of JP-A-2004-37887 (Patent Document 7) was used in contents as identified in Table 1, instead of the fluorinated surfactant (A11-1).
Evaluation Methods
(Evaluation of Surface Tension)

The surface tension of each of the antireflection coating compositions prepared in Examples and Comparative Examples was measured by a surface tension meter ESB-V (tradename, manufactured by Kyowa Chemical Industry Co., Ltd.). The results are shown in Table 1.
(Evaluation of Coating Properties and Refractive Index)

Each of the antireflection coating compositions prepared in Examples and Comparative Examples was applied to a silicon wafer by a spin coater, and heat-dried at 120° C. for 90 seconds by using a hotplate to obtain a film (antireflection film). The thickness was about 100 nm when the content of the water-soluble fluoropolymer (B1) was 6 mass % and about 40 nm when it was 3 mass %.

The outer appearance of the obtained film was visually observed and evaluated whether a uniform film is formed. The results are shown in Table 1. A case where the surface tension of the coating liquid was low, and radial spin coat trace remained on the film was marked "spin coat trace", and a case where the surface tension of the coating liquid was high, whereby no uniform film was obtained, and radial streaks occurred, is marked "radial streaks".

Further, the refractive index of the obtained film was measured by an ellipsometer. The refractive index was measured at 193 nm and at 248 nm which are exposure wavelengths commonly used in the photolithography. The results are shown in Table 1.

In general, the refractive index of a photoresist at the exposure wavelengths is from about 1.6 to about 1.8, and a favorable antireflection function will be obtained when the refractive index of the antireflection film formed on a photoresist layer is at most the above range.

From the results shown in Table 1, in Examples 1 to 4, the surface tension was decreased as compared with Comparative Example 5 wherein no surfactant was added, and even as compared with Comparative Examples 1 to 4 wherein a conventional surfactant was added, the surface tension was effectively decreased by addition in a smaller amount. Further, the refractive index of the film in Examples 1 to 4 was substantially equal to that in Comparative Example 5. Accordingly, it is understood that in Examples 1 to 4, the surface tension of the coating liquid is effectively decreased without deteriorating the refractive index of the film, whereby high coating performance can be obtained. On the other hand, in Comparative Example 2 wherein a conventional surfactant (NIKKOL) was added in a large amount to such an extent that favorable coating performance was obtained, the film was not transparent, and the refractive index could not be measured.

Further, the proper range of the surface tension of the coating liquid depends on the application method, and in the case of a spin coating method, it is understood that it is preferred that the fluorinated surfactant (A) is contained so that the surface tension of the antireflection coating composition will be from 13 to 35, preferably from about 15 to about 30, as the spin coating trace occurred in Example 1 and radial streaks occurred in Comparative Examples 1 to 4.

Further, in Comparative Examples 6 to 8 wherein no fluorinated surfactant (A) was contained, and dodecylbenzenesulfonic acid was added, the storage stability of the composition aqueous solution tends to be poor. In the evaluation of the film outer appearance in Comparative Example 8, "radial streaks*" means although radial streaks occurred, but the level of occurrence was lower than other Examples.

INDUSTRIAL APPLICABILITY

The antireflection coating composition of the present invention is suitable as a coating liquid to form an antireflection film for a photoresist. According to the present invention, an antireflection coating composition for a photoresist, having a low surface tension and excellent coating properties and capable of forming an antireflection film with a low refractive

TABLE 1

| | | Content of (B1) (mass %) | Surfactant Type | Surfactant Content (mass %) | Surface tension (N/m²) | Refractive index 193 nm | Refractive index 248 nm | Film outer appearance |
|---|---|---|---|---|---|---|---|---|
| Ex. | 1 | 6 | A11-1 | 3.6 | 12.8 | | | Spin coat trace |
| | 2 | | | 1.8 | 14.5 | 1.4845 | 1.4241 | Uniform film |
| | 3 | 3 | | 1 | 16.4 | | | Uniform film |
| | 4 | | | 0.3 | 28.4 | | | Uniform film |
| Comp. Ex. | 1-1 | 6 | A2-1 | 3.6 | 19.0 | 1.4825 | 1.4228 | Uniform film |
| | 1-2 | | | 1.8 | 24.8 | 1.4812 | 1.4221 | Uniform film |
| | 1-3 | 3 | | 1 | 28.4 | | | Uniform film |
| | 1-4 | | | 0.3 | 38.8 | | | Radial streaks |
| | 1 | 6 | NIKKOL | 3.6 | 30.4 | | | Radial streaks |
| | 2 | | | 5.4 | 30.9 | Measurement impossible | | Uniform film |
| | 3 | 3 | | 1 | 33.4 | | | Uniform film |
| | 4 | | | 0.3 | 34.1 | | | Radial streaks |
| | 5 | 3 | Nil | | 40 | 1.4808 | 1.4225 | Radial streaks |
| | 6 | 6 | Dodecylbenzenesulfonic acid | 3.6 | 29.5 | | | Radial streaks |
| | 7 | 3 | | 1 | 30.1 | | | Uniform film |
| | 8 | | | 0.3 | 30.8 | | | Radial streaks* | index, without use of PFOS nor PFOA having 7 or more carbon atoms which may be banned in view of influences over the environment, can be provided.

The entire disclosure of Japanese Patent Application No. 2007-042418 filed on Feb. 22, 2007 including specification, claims and summary is incorporated herein by reference in its entirety.

What is claimed is:

1. An antireflection coating composition which contains a fluorinated surfactant (A) containing a compound (A1) represented by the following formula (I), a water-soluble polymer (B) and an aqueous medium (C):

$$R^1-O-(R^2-O)_n-R^3-X^1 \quad (I)$$

wherein $R^1$ is a linear or branched perfluoroalkyl group of which the terminal fluorine atom may be substituted by a hydrogen atom or a chlorine atom, each of $R^2$ and $R^3$ which are independent of each other, is a linear or branched perfluoroalkylene group, provided that the total number of carbon atoms in $R^1$, $R^2$ and $R^3$ is at most 5, n is 0 or an integer of at least 1, $X^1$ is —COOH or —$C(CF_2Z^1)(CF_2Z^2)OH$, which may form a salt, and each of $Z^1$ and $Z^2$ is a hydrogen atom, a fluorine atom, a chlorine atom or a trifluoromethyl group.

2. The antireflection coating composition according to claim 1, wherein the fluorinated surfactant (A1) is a compound (A11) represented by the following formula (III):

$$M^1CF_2CF_2O(CF_2CF_2O)_pCF_2COOA^1 \quad (III)$$

wherein $M^1$ is a fluorine atom, a hydrogen atom or a chlorine atom, $A^1$ is a hydrogen atom, an alkali metal, $NH_4$, a monovalent group derived from an organic amine, or a quaternary ammonium group, and p is 0 or 1.

3. The antireflection coating composition according to claim 1, wherein the water-soluble polymer (B) contains a water-soluble fluoropolymer (B1) having polymerized units (b1) represented by the following formula (IV):

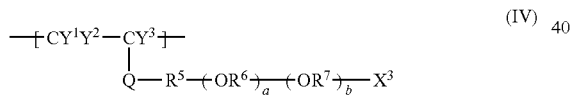

wherein each of $Y^1$ and $Y^2$ which are independent of each other, is a hydrogen atom, a fluorine atom or a chlorine atom, $Y^3$ is a hydrogen atom, a fluorine atom, a chlorine atom, a methyl group or a trifluoromethyl group, Q is an ether linkage or an ester linkage, each of $R^5$, $R^6$ and $R^7$ which are independent of one another, is a linear or branched perfluoroalkylene group having at most 6 carbon atoms, $X^3$ is a functional group having an acidic OH group which may form a salt, and each of "a" and "b" which are independent of each other, is 0 or an integer of at least 1.

4. The antireflection coating composition according to claim 1, which further contains an organic amine (D).

5. The antireflection coating composition according to claim 1, wherein the content of the fluorinated surfactant (A) is from 0.001 to 10 mass %.

6. The antireflection coating composition according to claim 1, wherein the content of the water-soluble polymer (B) is from 0.1 to 20 mass %.

7. The antireflection coating composition according to claim 1, wherein the content of the aqueous medium (C) is from 70 to 99.9 mass %.

8. The antireflection coating composition according to claim 1, wherein the mass average molecular weight (as calculated as PMMA by gel permeation chromatography) of the water-soluble polymer (B) is at least 1,000 and at most 50,000.

9. The antireflection coating composition according to claim 1, consisting of the compound (A1), the water-soluble polymer (B) and the aqueous medium (C).

10. The antireflection coating composition according to claim 1, that contains no perfluoroalkyl sulfonate having more than 7 carbon atoms and no perfluoroalkyl acid having more than 7 carbon atoms.

11. An antireflection film obtained by applying the antireflection coating composition of claim 1 onto a photoresist layer and removing the water from the antireflection coating composition.

12. The antireflection film according to claim 11, having a refractive index at 193 nm of about 1.4845.

13. The antireflection film according to claim 11, having a refractive index at 248 nm of about 1.4241.

14. The antireflection coating composition according to claim 1, having a surface tension of from 12.8 N/m² to 28.4 N/m².

15. A photolithography process, comprising:
    applying the antireflection coating composition of claim 1 onto a silicon wafer to form a layer of the antireflection coating composition on the silicon wafer;
    drying the layer to remove the water from the antireflection coating composition and form an antireflection film on the silicon wafer; and
    subjecting the antireflection film to photolithography.

16. The antireflection coating composition according to claim 1, wherein $R^1$ of formula (I) is substituted by a hydrogen atom or a chlorine atom.

* * * * *